(12) United States Patent
Naito et al.

(10) Patent No.: US 10,211,845 B2
(45) Date of Patent: Feb. 19, 2019

(54) SEMICONDUCTOR DEVICE AND METHOD THEREIN

(71) Applicant: RENESAS ELECTRONICS CORPORATION, Tokyo (JP)

(72) Inventors: Wataru Naito, Tokyo (JP); Takeshi Kondo, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/967,026

(22) Filed: Apr. 30, 2018

(65) Prior Publication Data

US 2018/0367157 A1 Dec. 20, 2018

(30) Foreign Application Priority Data

Jun. 20, 2017 (JP) ................................. 2017-120680

(51) Int. Cl.
*H03M 1/06* (2006.01)
*H03M 1/10* (2006.01)
*H04L 27/00* (2006.01)

(52) U.S. Cl.
CPC .. *H03M 1/1023* (2013.01); *H03M 2201/4212* (2013.01); *H04L 2027/0065* (2013.01); *H04L 2027/0067* (2013.01)

(58) Field of Classification Search
CPC ..... H04L 2027/0065; H04L 2027/0067; H04L 2027/0087; H04L 2027/0095; H04L 27/0014; H04L 27/2332; H04L 7/042
USPC ................. 375/324–329, 339–334
See application file for complete search history.

(56) References Cited

U.S. PATENT DOCUMENTS

| 4,057,762 | A | * | 11/1977 | Namiki | H04L 27/3818 375/327 |
| 5,905,405 | A | * | 5/1999 | Ishizawa | H04L 27/3827 329/306 |
| 6,363,126 | B1 | * | 3/2002 | Furukawa | H04L 27/066 375/332 |
| 6,442,383 | B1 | * | 8/2002 | Iemura | H03D 3/008 375/317 |
| 7,110,476 | B1 | * | 9/2006 | Tamura | H04L 7/042 375/327 |

(Continued)

FOREIGN PATENT DOCUMENTS

JP 2000-068752 A 3/2000

*Primary Examiner* — Linh V Nguyen
(74) *Attorney, Agent, or Firm* — McDermott Will & Emery LLP

(57) ABSTRACT

Degradation of a reception performance by an image signal is reduced. A semiconductor device includes: an oscillation circuit configured to generate a local signal; a mixer configured to multiply a reception signal by the local signal; an analog filter configured to filter a signal output from the mixer; an AD converter configured to digitalize a signal that has passed through the analog filter to generate a first signal; a digital filter configured to filter a signal that has passed through the AD converter to generate a second signal; a power comparator configured to detect the power difference between the first signal and the second signal; a register configured to store a theoretical power difference; and a determination unit configured to determine a frequency of the local signal based on the power difference from the theoretical power difference.

10 Claims, 11 Drawing Sheets

(56) References Cited

U.S. PATENT DOCUMENTS

| | | | | |
|---|---|---|---|---|
| 8,031,813 B2* | 10/2011 | Kim | ............... | H03D 1/24 |
| | | | | 375/326 |
| 2007/0050806 A1* | 3/2007 | Chan | ............... | H04H 60/32 |
| | | | | 725/20 |
| 2007/0080835 A1* | 4/2007 | Maeda | ............... | H03D 3/009 |
| | | | | 341/120 |
| 2010/0264978 A1* | 10/2010 | Sornin | ............... | H04B 1/28 |
| | | | | 327/358 |
| 2010/0311382 A1* | 12/2010 | Umeda | ............... | H03D 7/165 |
| | | | | 455/313 |
| 2014/0301516 A1* | 10/2014 | Mouri | ............... | H04L 27/2275 |
| | | | | 375/371 |

\* cited by examiner

SEMICONDUCTOR DEVICE AND METHOD THEREIN

CROSS-REFERENCE TO RELATED APPLICATIONS

This application is based upon and claims the benefit of priority from Japanese patent application No. 2017-120680, filed on Jun. 20, 2017, the disclosure of which is incorporated herein in its entirety by reference.

BACKGROUND

The present invention relates to a semiconductor device and a method therein, and relates to, for example, a semiconductor device used as a wireless receiver of a Low-Intermediate Frequency (IF) system and a method therein.

Japanese Unexamined Patent Application Publication No. 2000-068752 discloses a superheterodyne wireless receiver including an antenna, a tuning circuit, a high-frequency wave amplification circuit, a local oscillator, a mixer, an IF filter, and an IF amplification circuit. Since the superheterodyne wireless receiver is a general receiver and has a high frequency stability and selectivity, it is used in a wide range of communications and broadcasting fields in mobile telephones, televisions, and radios.

A problem in the superheterodyne system is that an image signal is generated. The image signal is an interfering wave signal received by an antenna and is a signal that is folded back into a reception bandwidth of a desired wave signal after it passes through the mixer. When, for example, the frequency of the desired wave signal received by the antenna is represented by $f\_RF$, the frequency of a local signal is represented by $f\_LO$, and the frequency of the image signal is represented by $f\_IM$, $f\_RF-f\_LO=f\_LO-f\_IM$ is established when $f\_RF>f\_LO$.

In the superheterodyne system, it is known that the image signal is decayed by a filter such as a tuning circuit before the image signal is input to the mixer, thereby reducing degradation of the reception performance by the image signal.

Further, a wireless receiver of a Low-IF system, the configuration of which is the same as that of the superheterodyne receiver but the IF frequency of which is smaller than that of the superheterodyne receiver, is known. One of the advantages in the wireless receiver of the Low-IF system is that since the IF frequency of the Low-IF system is smaller than that of the superheterodyne system, digital processing at the subsequent stage can be easily performed.

SUMMARY

However, in the Low-IF system, the frequency of the reception desired wave signal and the frequency of the image signal are close to each other. Therefore, there is a problem that it is difficult to sufficiently decay the image signal by the filter before it is input to the mixer and it is therefore difficult to reduce degradation of the reception performance by the image signal.

The other objects or problems and novel characteristics will be made apparent from the description of the specification and the attached drawings.

According to one embodiment, a semiconductor device includes: an oscillation circuit configured to generate a local signal; a mixer; an analog filter; an AD converter configured to digitalize a signal that has passed through the analog filter to generate a first signal; a digital filter configured to filter a signal that has passed through the AD converter to generate a second signal; a power comparator configured to detect the power difference between the power value of the first signal and the power value of the second signal; a register configured to store a theoretical power difference, which is a power difference between the power value of the first signal and the power value of the second signal when there is no interfering wave; and a determination unit configured to determine a frequency of the local signal based on the power difference detected by the power comparator and the theoretical power difference.

According the embodiment, it is possible to reduce degradation of the reception performance by the image signal.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

In the following embodiments, when necessary, the present disclosure is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle.

Prior to giving the description of embodiments, a relation between a desired wave bandwidth of a reception signal and an image signal will be explained with reference to FIGS. 12 and 13.

Figure 12:
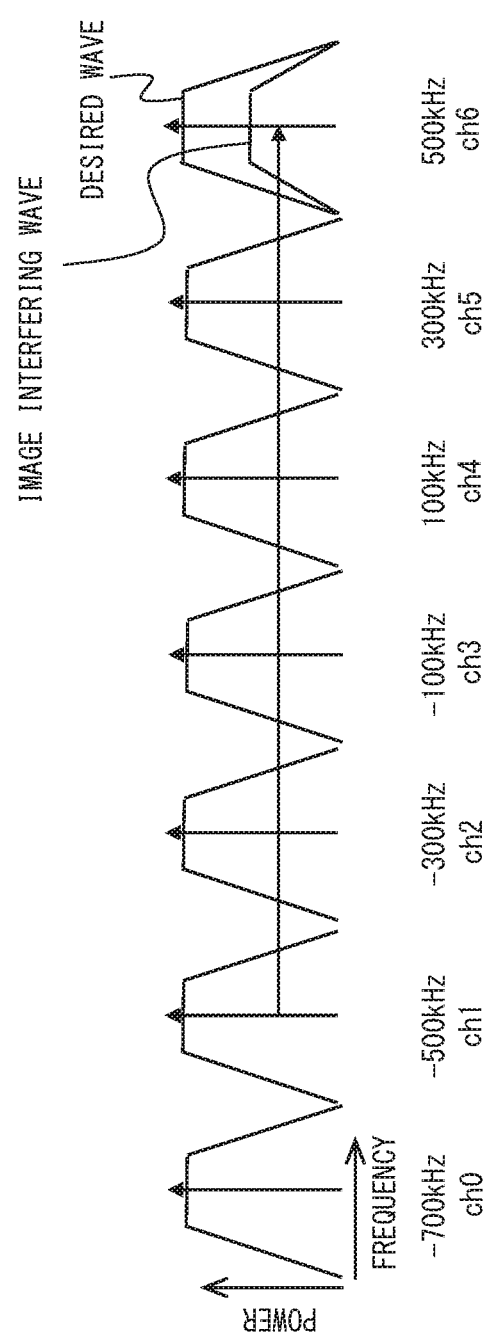
FIG. 12 is a diagram for describing a relation between a desired wave bandwidth of a reception signal and an image signal.

FIG. 12 is a diagram showing a relation between the desired wave bandwidth of the IF frequency and the image signal after the reception signal has passed through a mixer. FIG. 12 shows a case in which the channel spacing is 200 kHz, and communication is carried out using a channel 6 (ch6) centered at 500 kHz as the IF frequency. In this case, a signal of ch1 centered at −500 kHz is folded back into a desired wave bandwidth of ch6 after it passes through the mixer. Accordingly, in the example shown in FIG. 12, the reception performance of ch6 is degraded by the image signal of ch1.

Figure 13:
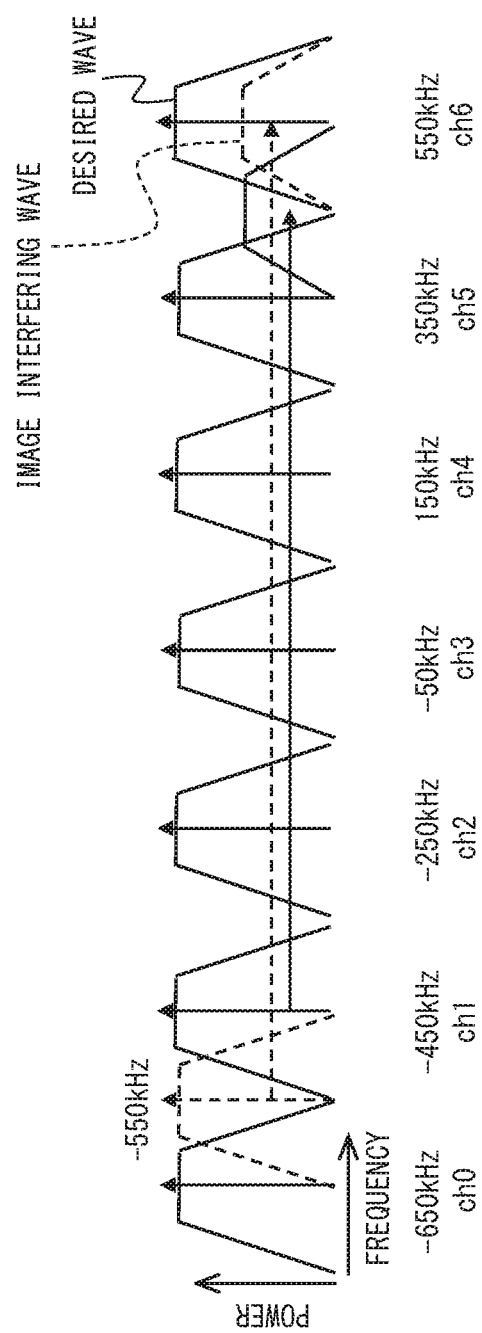
FIG. 13 is a diagram for describing a relation between the desired wave bandwidth of the reception signal and the image signal.

As shown in the example shown in FIG. 13, it is possible to reduce the degradation of the reception performance of ch6 due to the image signal of ch1 by changing the IF frequency of ch6. In the example shown in FIG. 13, the central frequency of ch6 is set to 550 kHz. In this case, the signal of ch1 centered at −450 kHz is folded back into 450 kHz after it passes through the mixer. Therefore, the central frequency of the folded signal of ch1 and the central frequency of ch6 are separated from each other by 100 kHz. Accordingly, in the example shown in FIG. 13, it is possible to reduce the degradation of the reception performance of ch6 due to the image signal of ch1 compared to that of the example shown in FIG. 12.

However, even in the example shown in FIG. 13, as shown by the dotted line in FIG. 13, when there is an image signal in −550 kHz, this image signal is folded back into the desired wave bandwidth of ch6 after it passes through the mixer. In view of this point, the present inventors have come up with the idea of adaptively switching the IF frequency at the time of starting the communication.

Specific embodiments will be explained hereinafter in detail with reference to the drawings. The following description and the drawings may be omitted and simplified as appropriate for clarity of explanation. In the drawings, the same elements are denoted by the same reference signs, and repetitive descriptions will be avoided as necessary.

First Embodiment

Figure 1:
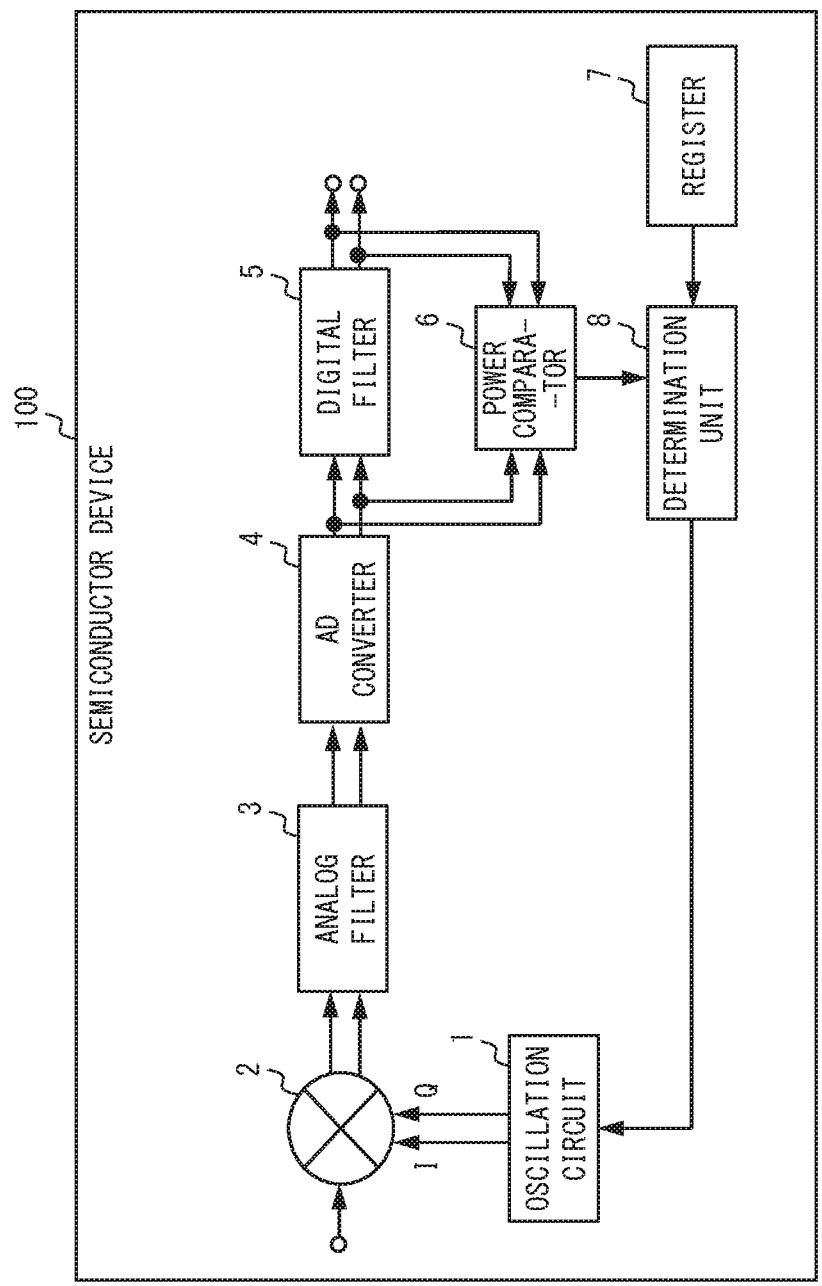
FIG. 1 is a block diagram showing a configuration example of a semiconductor device according to a first embodiment.

FIG. 1 is a block diagram showing a configuration example of a semiconductor device 100 according to a first embodiment. The semiconductor device 100 includes an oscillation circuit 1, a mixer 2, an analog filter 3, an AD converter 4, a digital filter 5, a power comparator 6, a register 7, and a determination unit 8. Further, while the semiconductor device 100 is used, for example, as a wireless receiver that receives a signal in a SubGHz band, this is merely an example.

The oscillation circuit 1 is an oscillation circuit that generates local signals. The oscillation circuit 1 outputs the local signals to the mixer 2. While I and Q local signals whose phases are deviated from each other by 90° are used in this example, one local signal may be used depending on the architecture of the receiver.

The mixer 2 receives a reception signal received by the semiconductor device 100. The mixer 2 further receives the local signals from the oscillation circuit 1. Further, the mixer 2 multiplies the reception signal by the local signals. Then the mixer 2 outputs the resulting signal generated by the multiplication to the analog filter 3.

The analog filter 3 filters the signal output from the mixer 2. Further, the analog filter 3 outputs the signal generated by the filtering to the AD converter 4.

The AD converter 4 digitalizes the signal output from the analog filter 3 to generate a first signal. Then the AD converter 4 outputs the first signal that has been generated to the digital filter 5 and the power comparator 6.

The digital filter 5 filters the first signal to generate a second signal. Then the digital filter 5 outputs the second signal that has been generated to the power comparator 6. The bandwidth of the digital filter 5 is narrower than the bandwidth of the analog filter 3.

The power comparator 6 receives the first signal from the AD converter 4. Further, the power comparator 6 receives the second signal from the digital filter 5. Further, the power comparator 6 detects the power difference between the power value of the first signal and the power value of the second signal. The power difference between the power value of the first signal and the power value of the second signal indicates a value obtained by subtracting the power band integral value of the second signal from the power band integral value of the first signal. Then the power comparator 6 outputs the power difference that has been detected to the determination unit 8.

The register 7 stores a theoretical power difference, which is a power difference between the power value of the first signal and the power value of the second signal when there is no interfering wave. The case in which there is no interfering wave means a case in which the interfering wave does not overlap the bandwidth of the analog filter 3 and the bandwidth of the digital filter 5.

Figure 2:
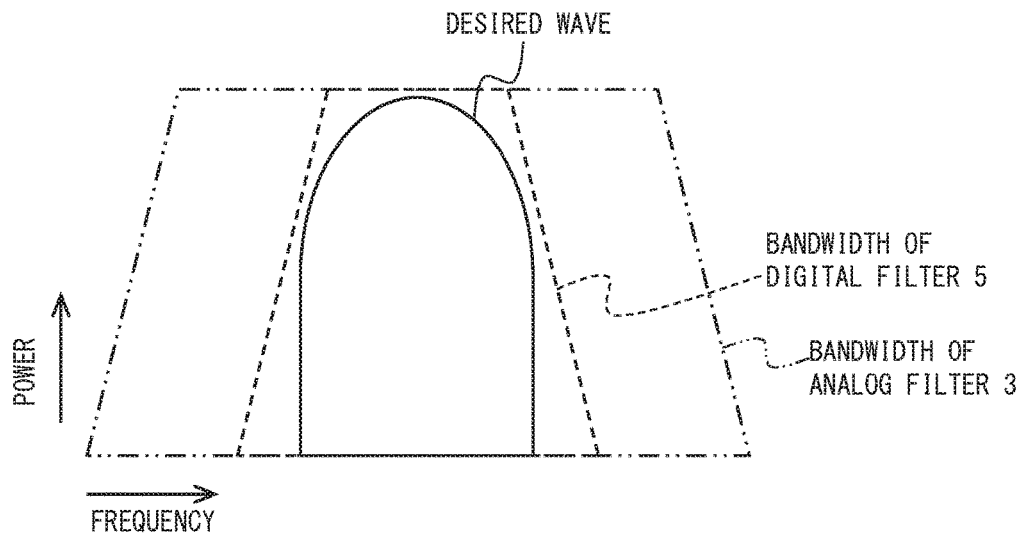
FIG. 2 is a diagram for describing a theoretical power difference according to the first embodiment.

For example, the theoretical power difference is a value obtained by subtracting the power band integral value of the second signal from the power band integral value of the first signal in a case in which the relation among a desired wave signal in the reception signal, the bandwidth of the analog filter 3, and the bandwidth of the digital filter 5 is shown in the example shown in FIG. 2. In the state shown in FIG. 2, the image interfering wave does not overlap the bandwidth of the analog filter 3 and the bandwidth of the digital filter 5. Accordingly, the theoretical power difference becomes a value in which the power of the desired wave signal has been canceled, that is, a value close to 0 by subtracting the power band integral value of the second signal from the power band integral value of the first signal.

The determination unit 8 receives the power difference between the power value of the first signal and the power value of the second signal from the power comparator 6. Further, the determination unit 8 reads out the theoretical power difference from the register 7. Further, the determination unit 8 determines the frequency of the local signals based on the power difference between the power value of the first signal and the power value of the second signal and the theoretical power difference. Then the determination unit 8 adjusts the frequency of the local signals generated by the oscillation circuit 1 to the frequency that has been determined.

Now, with reference to FIGS. 3 and 4, a method of determining the frequency of the local signals by the determination unit 8 will be explained. In the example shown in FIG. 3, the image interfering wave does not overlap the bandwidth of the desired wave. On the other hand, in the example shown in FIG. 4, the image interfering wave overlaps the bandwidth of the desired wave. Accordingly, in the example shown in FIG. 4, the reception performance is more degraded than the reception performance in FIG. 3 due to the influence of the image signal.

Figure 3:
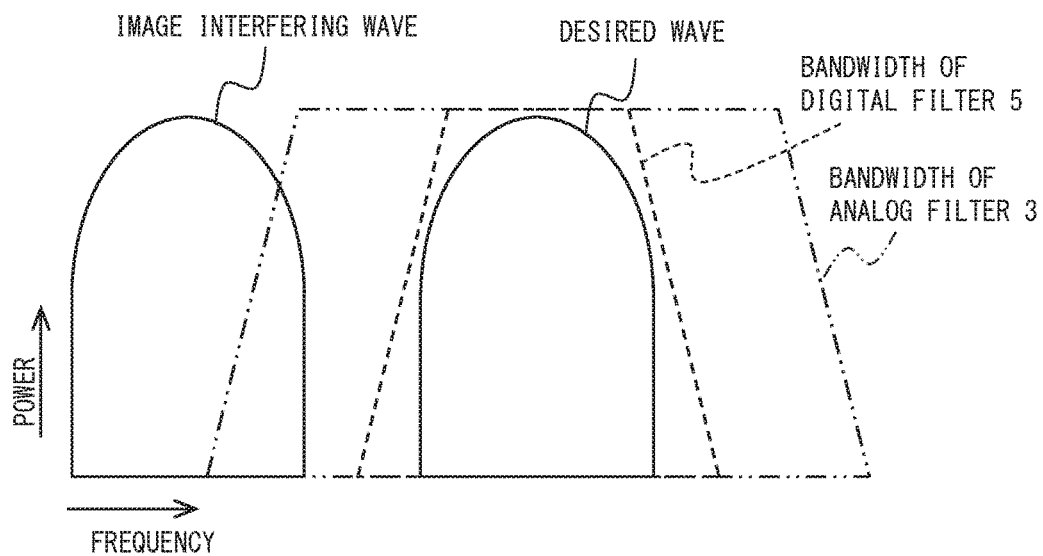
FIG. 3 is a diagram for describing a method of determining a frequency of a local signal according to the first embodiment.
Figure 4:
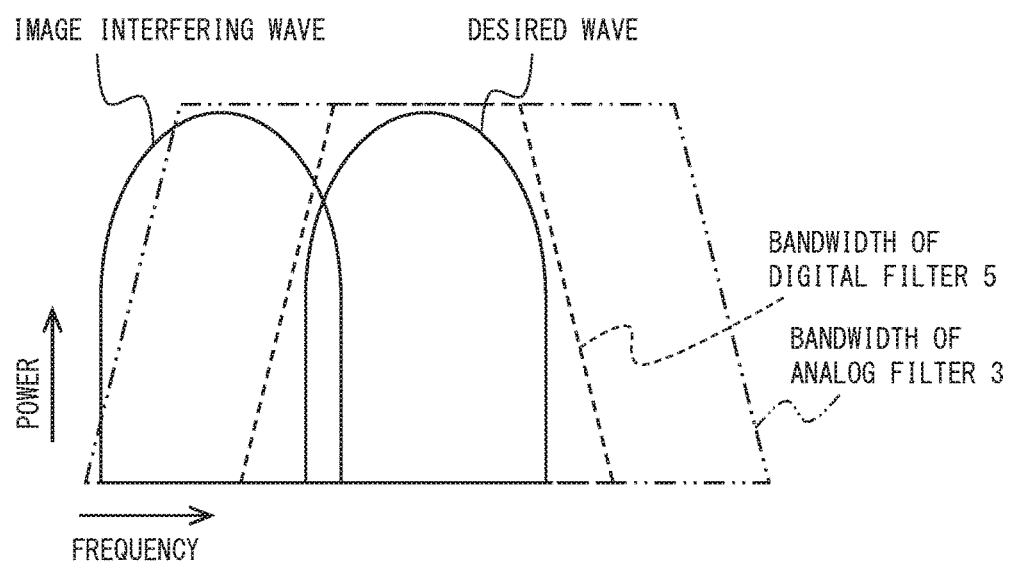
FIG. 4 is a diagram for describing the method of determining the frequency of the local signal according to the first embodiment.

Further, the power difference between the power value of the first signal and the power value of the second signal in the example shown in FIG. 3 is closer to the theoretical power difference than the power difference between the power value of the first signal and the power value of the second signal in the example shown in FIG. 4 is. Accordingly, by determining the frequency of the local signals in such a way that the power difference between the power value of the first signal and the power value of the second signal becomes close to the theoretical power difference, the degradation of the reception performance by the image signal can be reduced.

Figure 5:
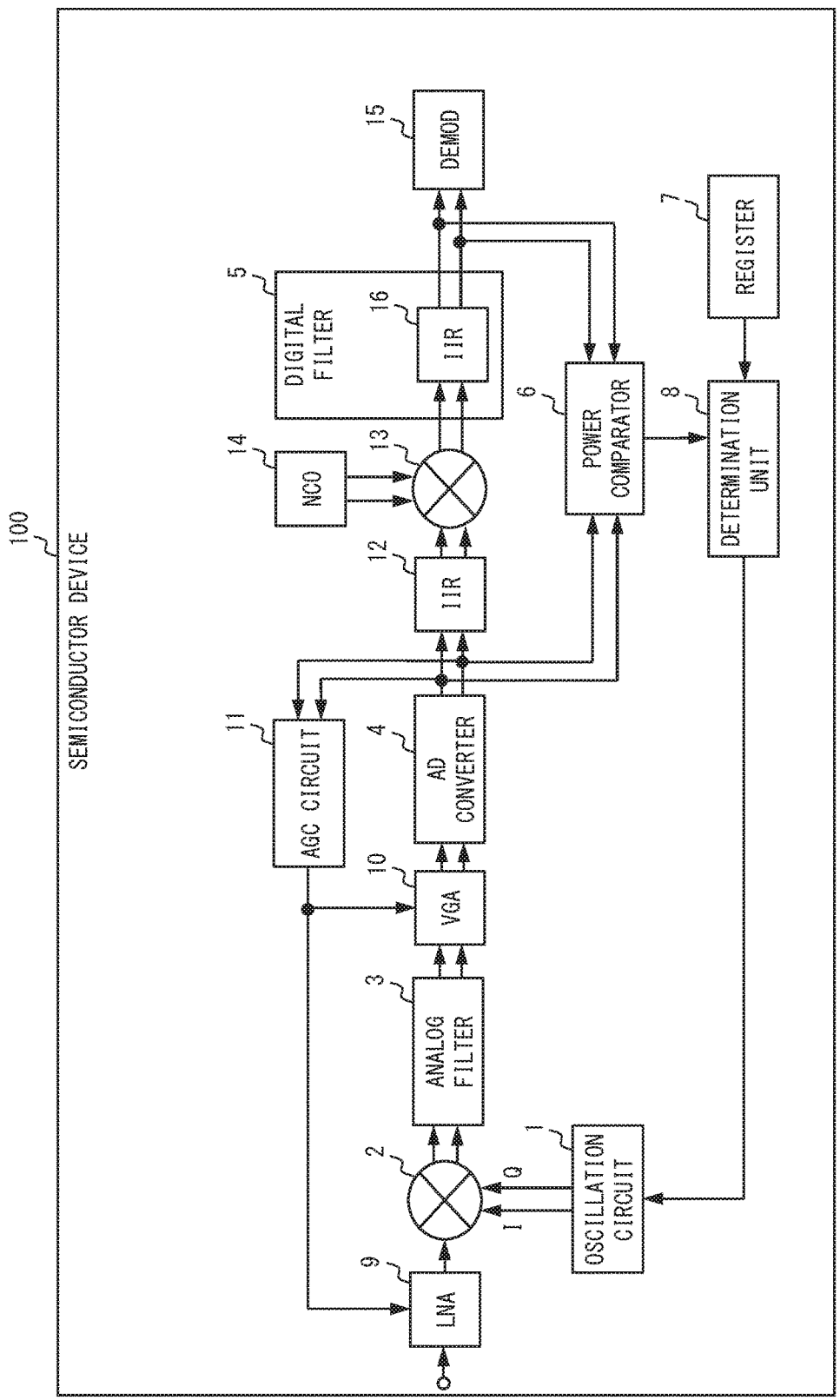
FIG. 5 is a block diagram showing a specific example of a configuration of the semiconductor device according to the first embodiment.

Next, with reference to a block diagram shown in FIG. 5, a specific example of a configuration of the semiconductor device 100 according to the first embodiment will be explained. The semiconductor device 100 is used, for example, as a Low-IF wireless receiver that receives a signal in a SubGHz band.

The semiconductor device 100 includes an oscillation circuit 1, a mixer 2, an analog filter 3, an AD converter 4, a digital filter 5, a power comparator 6, a register 7, a determination unit 8, a Low Noise Amplifier (LNA) 9, a Variable Gain Amplifiers (VGA) 10, an Automatic Gain Control (AGC) circuit 11, an Infinite impulse response (IIR) filter 12, a complex multiplier 13, a Numerical Controlled Oscillator (NCO) 14, and a Demodulator (DEMOD) 15. Further, the digital filter 5 includes an IIR filter 16.

A Radio Frequency (RF) signal in the SubGHz band that has been received by an antenna (not shown) is input to the LNA 9. The LNA 9 amplifies the RF signal and outputs the amplified signal to the mixer 2. In the example shown in FIG. 5, the LNA 9 is a variable-gain low-noise amplifier. The gain of the LNA 9 is controlled by the AGC circuit 11.

The oscillation circuit 1 is an oscillation circuit that generates local signals. The oscillation circuit 1 is, for example, a Phase Locked Loop (PLL) circuit. The oscillation circuit 1 outputs the local signals to the mixer 2. While I and Q local signals whose phases have been deviated from each other by 90° are used as an example, only one local signal may be used depending on the architecture of the receiver.

The mixer 2 multiplies the RF signal by the local signals to generate an IF signal. Then the mixer 2 outputs the IF signal that has been generated to the analog filter 3.

The analog filter 3 is an IF filter. The analog filter 3 filters the IF signal output from the mixer 2 to output the filtered signal to the VGA 10.

The VGA 10 amplifies the IF signal output from the analog filter 3 and outputs the amplified signal to the AD converter 4. The gain of the VGA 10 is controlled by the AGC circuit 11.

The AD converter 4 digitalizes the IF signal output from the VGA 10 to generate a first signal. Then the AD converter 4 outputs the first signal that has been generated to the AGC circuit 11, the IIR filter 12, and the power comparator 6.

The AGC circuit 11 receives the first signal from the AD converter 4. Further, the AGC circuit 11 controls the gains of the LNA 9 and the VGA 10 in such a way that the power value of the first signal becomes a predetermined power value.

The IIR filter 12 filters the first signal output from the AD converter 4 and outputs the resulting signal to the complex multiplier 13.

The NCO 14 generates an oscillation signal and outputs the oscillation signal to the complex multiplier 13.

The complex multiplier 13 performs complex multiplication on the first signal output from the IIR filter 12 and the oscillation signal output from the NCO 14 to generate a baseband signal. Then the complex multiplier 13 outputs the baseband signal that has been generated to the IIR filter 16.

The IIR filter 16 filters the baseband signal output from the complex multiplier 13 to generate a second signal. Then the IIR filter 16 outputs the second signal that has been generated to the DEMOD 15 and the power comparator 6.

The DEMOD 15 demodulates the second signal output from the IIR filter 16.

The power comparator 6 receives the first signal from the AD converter 4. Further, the power comparator 6 receives the second signal from the IIR filter 16. Further, the power comparator 6 detects the power difference between the power value of the first signal and the power value of the second signal. Then the power comparator 6 outputs the power difference that has been detected to the determination unit 8.

The determination unit 8 determines the frequency of the local signals from among n (n is a natural number) candidate frequencies based on the power difference detected by the power comparator 6 and the theoretical power difference.

Specifically, the determination unit 8 controls the oscillation circuit 1 in such a way that the oscillation circuit 1 generates local signals of the n types of candidate frequencies. Further, the determination unit 8 receives, for each of the n types of candidate frequencies, the power difference between the power value of the first signal and the power value of the second signal from the power comparator 6. That is, the determination unit 8 receives the n power differences from the power comparator 6. Further, the determination unit 8 reads out the theoretical power difference from the register 7. Further, the determination unit 8 selects one of the n power differences that is the closest to the theoretical power difference. Further, the determination unit 8 determines the candidate frequency that corresponds to the closest power difference that has been selected as the frequency of the local signals. Then the determination unit 8 adjusts the frequency of the local signals generated by the oscillation circuit 1 to the frequency that has been determined.

Figure 6:
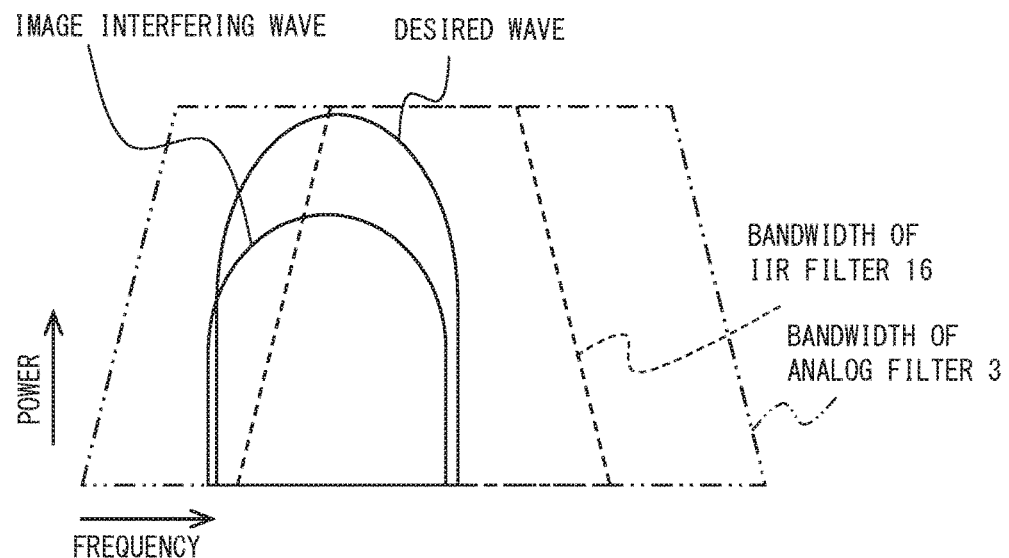
FIG. 6 is a diagram for describing processing of a determination unit of the semiconductor device according to the first embodiment.
Figure 7:
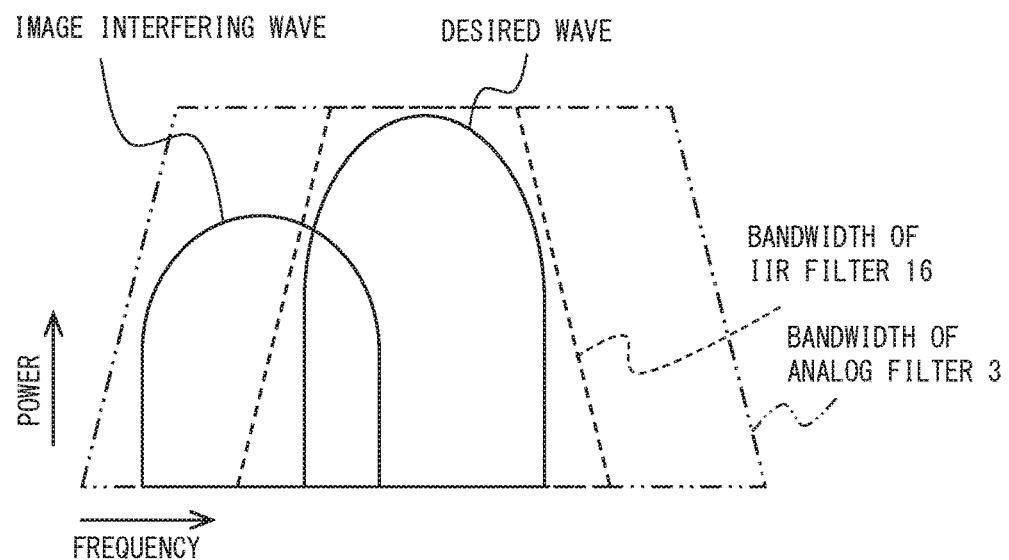
FIG. 7 is a diagram for describing the processing of the determination unit of the semiconductor device according to the first embodiment.
Figure 8:
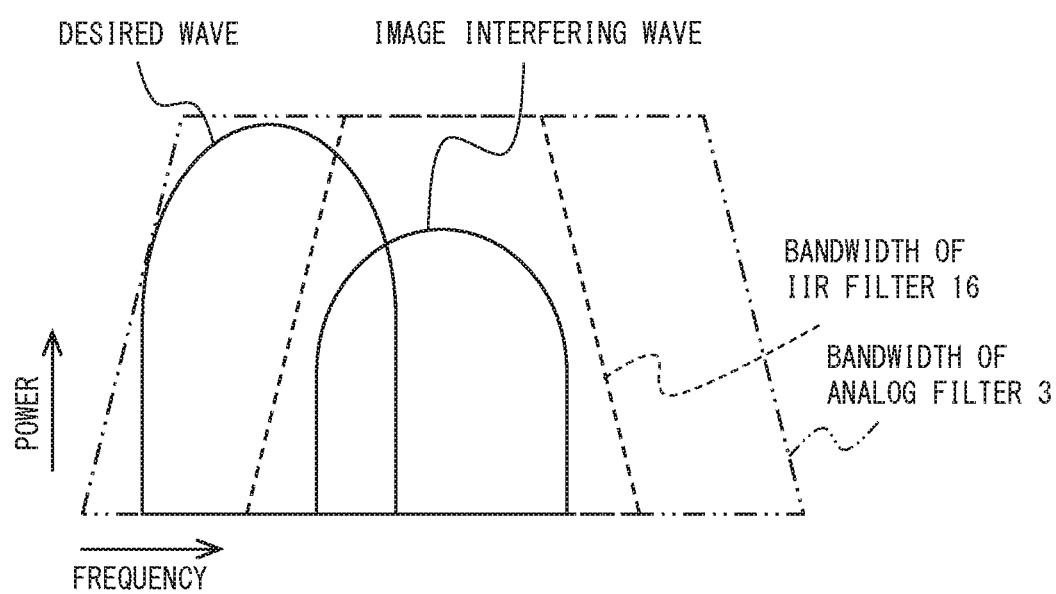
FIG. 8 is a diagram for describing the processing of the determination unit of the semiconductor device according to the first embodiment.

With reference now to FIGS. 6 to 8, the processing in the determination unit 8 will be explained. It is assumed in this description that the desired wave frequency received by the antenna is 1 GHz, the initial configuration value of the local frequency is 999.5 MHz, and the initial IF frequency is 500 kHz. It is further assumed that three types of candidate frequencies: 0 ppm (999.5 MHz); −100 ppm (999.4 MHz), and +100 ppm (999.6 MHz) are used as the n types of candidate frequencies of the local signals. When the candidate frequencies of the local signals are 0 ppm (999.5 MHz), −100 ppm (999.4 MHz), and +100 ppm (999.6 MHz), the IF frequencies will be 500 kHz, 600 kHz, and 400 kHz, respectively.

Note that the candidate frequency may be set based on, for example, the data rate of the signal received by the semiconductor device 100. When, for example, the data rate of the signal received by the semiconductor device 100 is 100 kbps, the candidate frequency may be set at intervals of 100 ppm.

First, the determination unit 8 controls the oscillation circuit 1 in such a way that the frequency of the local signals becomes 0 ppm (999.5 MHz). Accordingly, the power comparator 6 detects the power difference between the power value of the first signal and the power value of the second signal when the frequency of the local signals is 0 ppm. Then the determination unit 8 receives the power difference between the power value of the first signal and the power value of the second signal when the frequency of the local signals is 0 ppm from the power comparator 6.

FIG. 6 is a diagram showing one example of a relation among the reception desired wave signal, the image interfering wave, the bandwidth of the analog filter 3, and the bandwidth of the IIR filter 16 in a case in which the frequency of the local signals is 0 ppm (999.5 MHz). In this case, since the image interfering wave overlaps the desired wave, the power difference between the power value of the first signal and the power value of the second signal is deviated from the theoretical power difference.

Next, the determination unit 8 controls the oscillation circuit 1 in such a way that the frequency of the local signals becomes −100 ppm (999.4 MHz). Accordingly, the power comparator 6 detects the power difference between the power value of the first signal and the power value of the second signal when the frequency of the local signals is −100 ppm. Then the determination unit 8 receives the power difference between the power value of the first signal and the power value of the second signal when the frequency of the local signals is −100 ppm from the power comparator 6.

FIG. 7 is a diagram showing an example of the relation among the reception desired wave signal, the image interfering wave, the bandwidth of the analog filter 3, and the bandwidth of the IIR filter 16 in a case in which the frequency of the local signals is −100 ppm (999.4 MHz). In this case, the desired wave is at the center of the IIR filter 16, and the image interfering wave is deviated in such a way that it falls outside the bandwidth of the IIR filter 16. Therefore, the power difference between the power value of the first signal and the power value of the second signal comes close to the theoretical power difference.

Next, the determination unit 8 controls the oscillation circuit 1 in such a way that the frequency of the local signals becomes +100 ppm (999.6 MHz). Accordingly, the power comparator 6 detects the power difference between the power value of the first signal and the power value of the second signal when the frequency of the local signals is +100 ppm. Then the determination unit 8 receives the power difference between the power value of the first signal and the power value of the second signal when the frequency of the local signals is +100 ppm from the power comparator 6.

FIG. 8 is a diagram showing one example of the relation among the reception desired wave signal, the image interfering wave, the bandwidth of the analog filter 3, and the bandwidth of the IIR filter 16 in a case in which the frequency of the local signals is +100 ppm (999.6 MHz). In this case, the desired wave is deviated in such a way that it falls outside the IIR filter 16. Therefore, the power difference between the power value of the first signal and the power value of the second signal is deviated from the theoretical power difference.

Next, the determination unit 8 selects one of the three power differences that is the closest to the theoretical power difference. In this example, the power difference between the power value of the first signal and the power value of the second signal in the case in which the frequency of the local signals is −100 ppm is the closest to the theoretical power difference. Therefore, the determination unit 8 selects the power difference when the frequency is −100 ppm.

Next, the determination unit 8 determines −100 ppm (999.4 MHz), which is the candidate frequency that corresponds to the closest power difference that has been selected, to be the frequency of the local signals. Then the determination unit 8 adjusts the frequency of the local signals generated by the oscillation circuit 1 to be 999.4 MHz.

Figure 9:
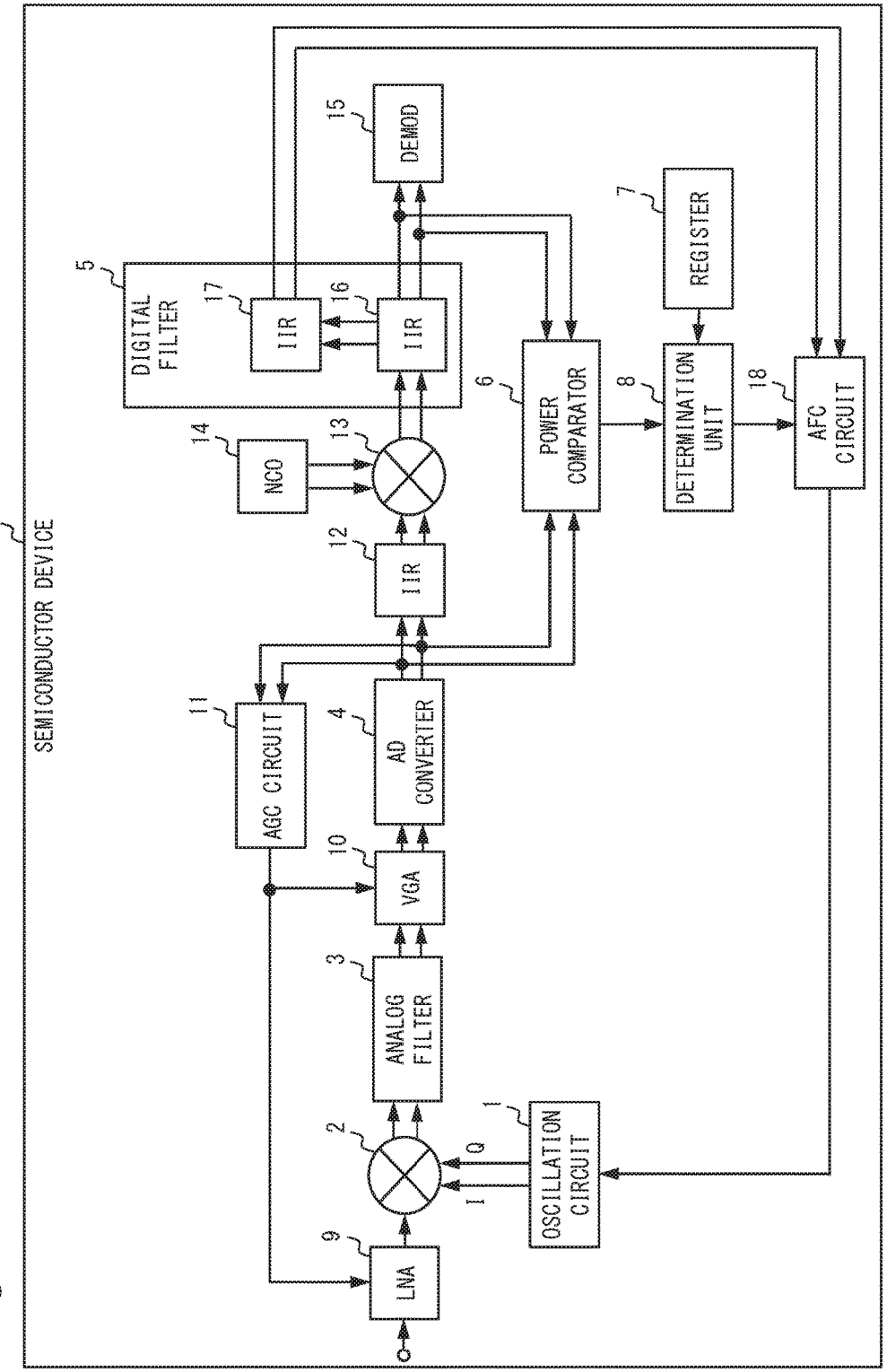
FIG. 9 is a block diagram showing another example of the configuration of the semiconductor device according to the first embodiment.

The semiconductor device 100 according to the first embodiment may further include an IIR filter 17 and an Automatic frequency control (AFC) circuit 18, as shown in the block diagram shown in FIG. 9.

The IIR filter 17 receives the second signal from the IIR filter 16. Further, the IIR filter 17 filters the second signal and outputs the filtered second signal to the AFC circuit 18.

The AFC circuit 18 executes the AFC using the signal input from the IIR filter 17. Then the AFC circuit 18 feeds back the result of the AFC to the oscillation circuit 1, thereby adjusting the local frequency to correct the frequency deviation.

Further, the AFC circuit 18 receives the candidate frequency from the determination unit 8. Then the AFC circuit 18 controls the oscillation circuit 1 in such a way that the frequency of the local signals becomes the candidate frequency.

The AFC circuit 18 further receives the frequency that has been determined to be the frequency of the local signals from the determination unit 8. Then the AFC circuit 18 controls the oscillation circuit 1 in such a way that the frequency of the local signals becomes the frequency that has been determined.

Figure 10:
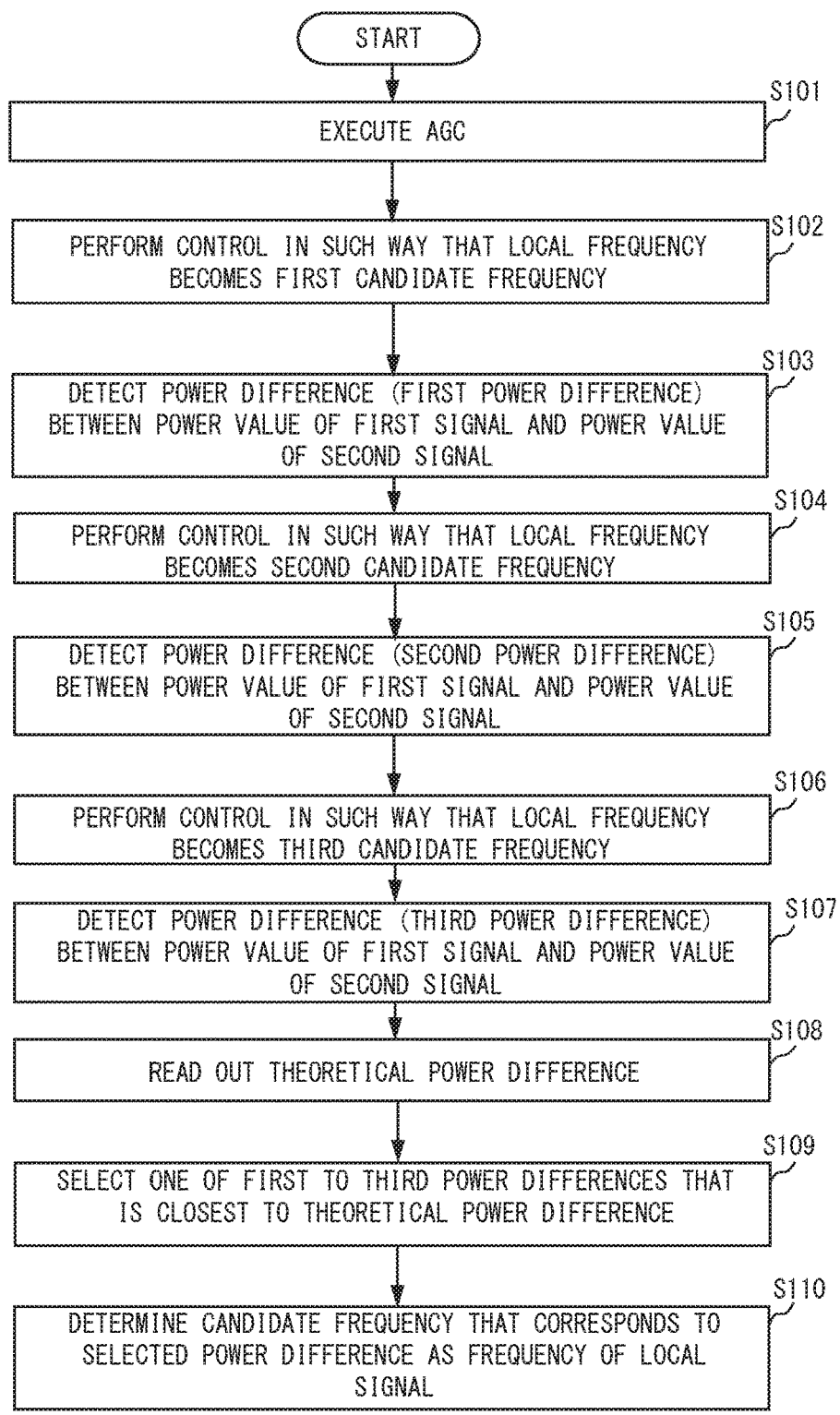
FIG. 10 is a flowchart showing a process example of the semiconductor device according to the first embodiment.

Next, with reference to a flowchart shown in FIG. 10, processing of the semiconductor device 100 according to the first embodiment will be explained. The flowchart shown in FIG. 10 is an example in which the conditions similar to those shown in FIGS. 6-8 are used, that is, the case in which the three candidate frequencies are used.

First, the semiconductor device 100 executes the AGC by the AGC circuit 11 (Step S101).

Next, the semiconductor device 100 controls, by the determination unit 8, the oscillation circuit 1 in such a way that the frequency of the local signals becomes a first candidate frequency (Step S102). The first candidate frequency is, for example, the frequency of 0 ppm. When the frequency of 0 ppm is used as the first candidate frequency, the semiconductor device 100 may control the oscillation circuit 1 in such a way that the frequency of the local signals becomes the first candidate frequency by controlling, by the AFC circuit 18, the AFC.

Next, the semiconductor device 100 detects the power difference between the power value of the first signal and the power value of the second signal when the frequency of the local signals is the first candidate frequency by the power comparator 6 (Step S103). This power difference is also referred to as a first power difference.

Next, the semiconductor device 100 controls the oscillation circuit 1 by the determination unit 8 in such a way that the frequency of the local signals becomes a second candidate frequency (Step S104). The second candidate frequency is, for example, the frequency of −100 ppm.

Next, the semiconductor device 100 detects, by the power comparator 6, the power difference between the power value of the first signal and the power value of the second signal when the frequency of the local signals is the second candidate frequency (Step S105). This power difference is also referred to as a second power difference.

Next, the semiconductor device 100 controls the oscillation circuit 1 by the determination unit 8 in such a way that the frequency of the local signals becomes a third candidate frequency (Step S106). The third candidate frequency is, for example, the frequency of +100 ppm.

Next, the semiconductor device 100 detects, by the power comparator 6, the power difference between the power value of the first signal and the power value of the second signal when the frequency of the local signals is the third candidate frequency (Step S107). This power difference is also referred to as a third power difference.

Next, the semiconductor device 100 reads out the theoretical power difference from the register 7 by the determination unit 8 (Step S108).

Next, the semiconductor device 100 selects one of the first to third power differences that is the closest to the theoretical power difference by the determination unit 8 (Step S109).

The semiconductor device 100 then determines, by the determination unit 8, the candidate frequency that corresponds to the power difference selected in Step S109 as the frequency of the local signals (Step S110).

As described above, the semiconductor device 100 according to the first embodiment is configured to include the oscillation circuit 1, the mixer 2, the analog filter 3, the AD converter 4 that digitalizes the signal that has passed through the analog filter 3 to generate the first signal, and the digital filter 5 that filters the signal that has passed through the AD converter 4 to generate the second signal. Further, the semiconductor device 100 is configured to include the power comparator 6 that detects the power difference between the power value of the first signal and the power value of the second signal. Further, the semiconductor device 100 is configured to include the register 7 that stores the theoretical power difference, which is the power difference between the power value of the first signal and the power value of the second signal when there is no interfering wave. Further, the semiconductor device 100 is configured to include the determination unit 8 that determines the frequency of the local signals based on the power difference that has been detected by the power comparator 6 and the theoretical power difference. Accordingly, the semiconductor device 100 is able to determine the frequency of the local signals in such a way that the power difference becomes close to the theoretical power difference when there is no interfering wave. That is, the semiconductor device 100 is able to adaptively switch the IF frequency and to reduce degradation of the reception performance by the image signal.

Further, the semiconductor device 100 is configured to determine, by the determination unit 8, the frequency of the local signals from among the n types of candidate frequencies based on the power difference detected by the power comparator 6 and the theoretical power difference. Accordingly, the semiconductor device 100 is able to select the frequency of the local signals from among the n types of candidate frequencies in such a way that the power difference becomes close to the theoretical power difference when there is no interfering wave. Further, by setting the value of n in such a way as to satisfy demodulation time restrictions in the system, the IF frequency can be adaptively switched without affecting the system.

Further, the semiconductor device 100 is configured to control the oscillation circuit 1 by the determination unit 8 in such a way that the oscillation circuit 1 generates the local signals of the n types of candidate frequencies. Further, the semiconductor device 100 is configured to detect, by the power comparator 6, n power differences by detecting the power difference between the power value of the first signal and the power value of the second signal for each of the n types of candidate frequencies. Further, the semiconductor device 100 is configured to select, by the determination unit 8, one of the n power differences that is the closest to the theoretical power difference and determine the candidate frequency that corresponds to the closest power difference as the frequency of the local signals. Accordingly, the semiconductor device 100 is able to determine the candidate frequency that corresponds to the power difference that is the closest to the theoretical power difference from among the n types of candidate frequencies to be the frequency of the local signals.

Second Embodiment

Next, a semiconductor device 100A according to a second embodiment will be explained. Since the semiconductor device 100A is similar to the semiconductor device 100 according to the first embodiment except that the determination unit 8 is replaced by a determination unit 8A, the drawing and the description thereof will be omitted.

The determination unit 8A controls the oscillation circuit 1 in such a way that the oscillation circuit 1 generates the local signals of the n types of candidate frequencies. Further, the determination unit 8A receives the power difference between the power value of the first signal and the power value of the second signal from the power comparator 6 for each of n types of candidate frequencies. That is, the determination unit 8A receives the n power differences from the power comparator 6. Further, the determination unit 8A reads out the theoretical power difference from the register 7. The aforementioned processing of the determination unit 8A is similar to the processing of the determination unit 8.

Further, the determination unit 8A obtains the order of the n power differences closer to the theoretical power difference. Then the determination unit 8A determines a further candidate frequency of the local signals based on the order of the n power differences closer to the theoretical power difference.

The power comparator 6 further detects the power difference between the power value of the first signal and the power value of the second signal for the further candidate frequency.

The determination unit 8A selects the power difference that is the closest to the theoretical power difference from among the n power differences and the power difference of the further candidate frequency. Then the determination unit 8A determines the candidate frequency that corresponds to the closest power difference that has been selected to be the frequency of the local signals.

A specific example of the processing of the determination unit 8A will be explained. In the following description, it is assumed that the desired wave frequency received by the antenna is 1 GHz, the initial configuration value of the local frequency is 999.5 MHz, and the initial IF frequency is 500 kHz. It is further assumed that three types of candidate frequencies: 0 ppm (999.5 MHz); −100 ppm (999.4 MHz); and +100 ppm (999.6 MHz) are used as the n types of candidate frequencies of the local signals. The power difference in the case in which the candidate frequency is 0 ppm is also referred to as a first power difference. Further, the power difference in the case in which the candidate frequency is −100 ppm is also referred to as a second power difference. Further, the power difference in the case in which the candidate frequency is +100 ppm is also referred to as a third power difference.

The determination unit 8A obtains the order of the first power difference, the second power difference, and the third power difference closer to the theoretical power difference. Then the determination unit 8A determines the further candidate frequency of the local signals based on the order of the three power differences closer to the theoretical power difference.

When the order closer to the theoretical power difference is the first power difference, the second power difference, and the third power difference in the order of closeness, the determination unit 8A determines a frequency between 0 ppm and −100 ppm to be the further candidate frequency of the local signals. In this case, the determination unit 8A determines, for example, −50 ppm, which is an intermediate frequency between 0 ppm and −100 ppm, to be the further candidate frequency.

When the order closer to the theoretical power difference is the first power difference, the third power difference, and the second power difference in the order of closeness, the determination unit 8A determines a frequency between 0 ppm and +100 ppm to be the further candidate frequency of the local signals. In this case, the determination unit 8A determines, for example, +50 ppm, which is an intermediate frequency between 0 ppm and +100 ppm, to be the further candidate frequency.

When the order closer to the theoretical power difference is the second power difference, the first power difference, and the third power difference in the order of closeness, the determination unit 8A determines a frequency smaller than −100 ppm to be the further candidate frequency of the local signals. In this case, the determination unit 8A determines, for example, −150 ppm to be the further candidate frequency.

When the order closer to the theoretical power difference is the third power difference, the first power difference, and the second power difference in the order of closeness, the determination unit 8A determines a frequency larger than +100 ppm to be the further candidate frequency of the local signals. In this case, the determination unit 8A determines, for example, +150 ppm to be the further candidate frequency.

The determination unit 8 receives the power difference between the power value of the first signal and the power value of the second signal when the frequency of the local signals is the further candidate frequency from the power comparator 6.

The determination unit 8A selects the power difference that is the closest to the theoretical power difference from among the first power difference, the second power difference, and the third power difference, and the power difference of the further candidate frequency. Then the determination unit 8A determines the candidate frequency that corresponds to the closest power difference that has been selected to be the frequency of the local signals.

Figure 11:
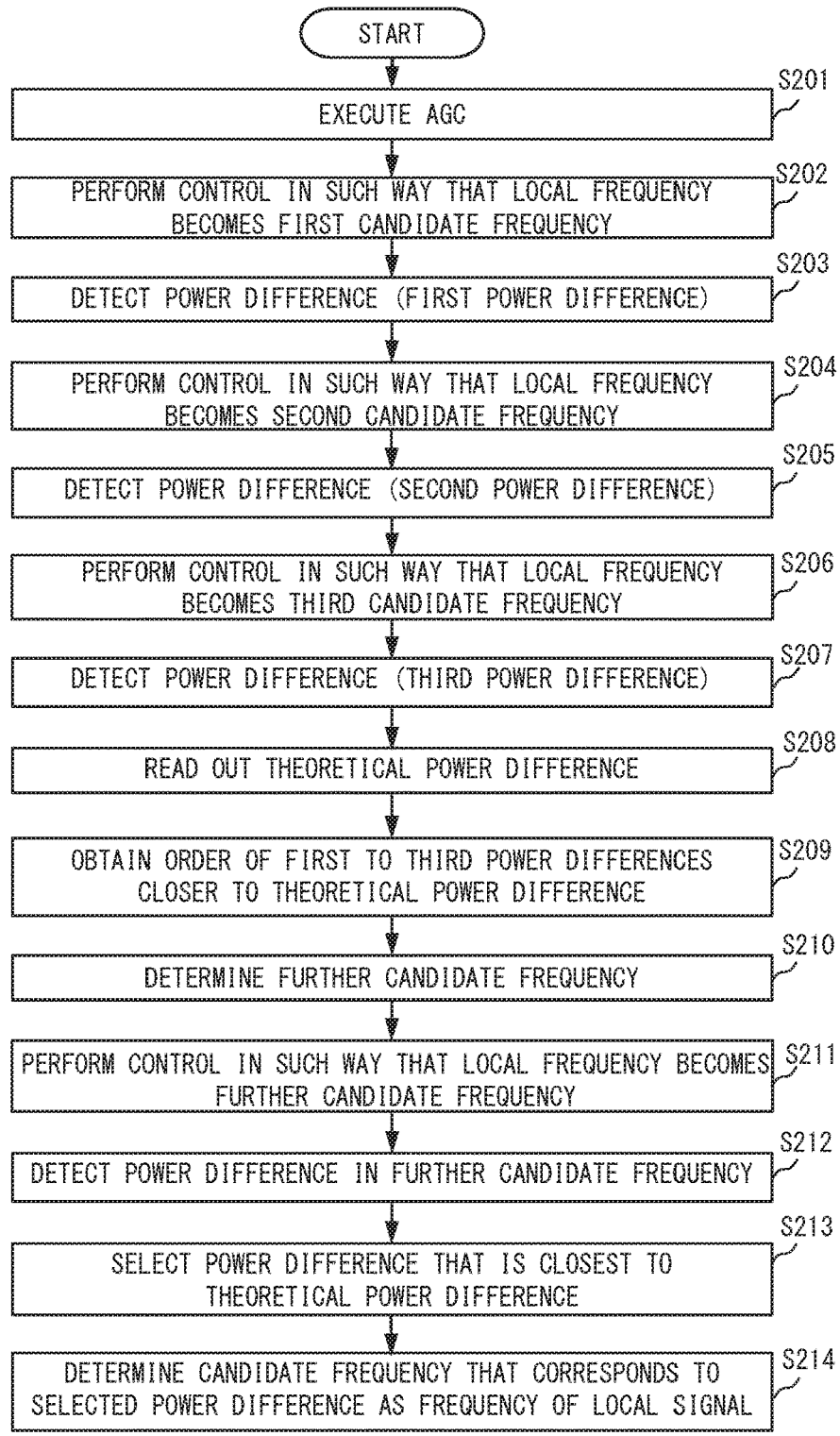
FIG. 11 is a flowchart showing a process example of a semiconductor device according to a second embodiment.

Next, with reference to a flowchart shown in FIG. 11, processing of the semiconductor device 100A according to the second embodiment will be explained. The flowchart shown in FIG. 11 is an example in which the three candidate frequencies and the further candidate frequency are used.

Since Steps S201-S208 are similar to Steps S101-S108 in FIG. 10, the description thereof will be omitted.

The semiconductor device 100A obtains, by the determination unit 8A, the order of the first to third power differences closer to the theoretical power difference (Step S209).

Next, the semiconductor device 100A determines, by the determination unit 8A, the further candidate frequency of the local signals based on the order closer to the theoretical power difference obtained in Step S209 (Step S210).

Next, the semiconductor device 100A controls the oscillation circuit 1 by the determination unit 8A in such a way that the frequency of the local signals becomes the further candidate frequency determined in Step S210 (Step S211).

Next, the semiconductor device 100A detects, by the power comparator 6, the power difference between the power value of the first signal and the power value of the second signal when the frequency of the local signals is the further candidate frequency (Step S212).

Next, the semiconductor device 100A selects, by the determination unit 8A, one of the first to third power differences and the power difference of the further candidate frequency that is the closest to the theoretical power difference (Step S213).

Then the semiconductor device 100A determines, by the determination unit 8A, the candidate frequency that corresponds to the power difference selected in Step S213 to be the frequency of the local signals (Step S214).

As described above, the semiconductor device 100A according to the second embodiment is configured to control the oscillation circuit 1 by the determination unit 8A in such a way that the oscillation circuit 1 generates the local signals of the n types of candidate frequencies. Further, the semiconductor device 100A is configured to detect, by the power comparator 6, the n power differences by detecting the power difference between the power value of the first signal and the power value of the second signal for each of the n types of candidate frequencies. Further, the semiconductor device 100A is configured to obtain, by the determination unit 8A, the order of the n power differences closer to the theoretical power difference. Further, the semiconductor device 100A is configured to determine, by the determination unit 8A, the further candidate frequency of the local signals based on the order closer to the theoretical power difference. Accordingly, the semiconductor device 100A according to the second embodiment is able to determine the candidate frequency that may correspond to the power difference that is closer to the theoretical power difference than the n types of candidate frequencies are as the (n+1)-th type of candidate frequency.

Further, the semiconductor device 100A is configured to further detect, by the power comparator 6, the power difference between the power value of the first signal and the power value of the second signal for the further candidate frequency. Further, the semiconductor device 100A is configured to select, by the determination unit 8A, one of the n power differences and the power difference of the further candidate frequency that is the closest to the theoretical power difference and to determine the candidate frequency that corresponds to the closest power difference to be the frequency of the local signals. Accordingly, the semiconductor device 100A may determine the candidate frequency that corresponds to the power difference that is closer to the theoretical power difference compared to the case in which the candidate frequency that corresponds to the power difference that is the closest to the theoretical power difference is determined from among the n types of candidate frequencies. That is, in the semiconductor device 100A, it is possible to further reduce degradation of the reception performance by the image signal.

The processing of the power comparator and the determination unit described in the embodiments can be achieved, for example, by causing at least one processor (e.g. Micro Processing Unit (MPU)) to execute a program.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    an oscillation circuit configured to generate a local signal;
    a mixer configured to multiply a reception signal by the local signal;
    an analog filter configured to filter a signal output from the mixer;
    an AD converter configured to digitalize a signal that has passed through the analog filter to generate a first signal;
    a digital filter configured to filter a signal that has passed through the AD converter to generate a second signal;
    a power comparator configured to detect the power difference between the power value of the first signal and the power value of the second signal;
    a register configured to store a theoretical power difference, which is a power difference between the power value of the first signal and the power value of the second signal when there is no interfering wave; and
    a determination unit configured to determine a frequency of the local signal based on the power difference detected by the power comparator and the theoretical power difference.

2. The semiconductor device according to claim 1, wherein the determination unit determines the frequency of the local signal from among n types of (n is a natural number) candidate frequencies based on the power difference and the theoretical power difference.

3. The semiconductor device according to claim 2, wherein
    the determination unit controls the oscillation circuit in such a way that the oscillation circuit generates local signals of the n types of candidate frequencies,
    the power comparator detects, for each of the n types of candidate frequencies, n power differences by detecting the power difference between the power value of the first signal and the power value of the second signal; and
    the determination unit selects the power difference that is the closest to the theoretical power difference from among the n power differences and determines the candidate frequency that corresponds to the closest power difference as the frequency of the local signal.

4. The semiconductor device according to claim 1, wherein
    the determination unit controls the oscillation circuit in such a way that the oscillation circuit generates local signals of n types of (n is a natural number) candidate frequencies,
    the power comparator detects, for each of the n types of candidate frequencies, n power differences by detecting the power difference between the power value of the first signal and the power value of the second signal; and
    the determination unit obtains the order of the n power differences closer to the theoretical power difference and determines a further candidate frequency of the local signal based on the order of the closeness.

5. The semiconductor device according to claim 4, wherein
    the power comparator further detects, for the further candidate frequency, the power difference between the power value of the first signal and the power value of the second signal, and
    the determination unit selects the power difference that is the closest to the theoretical power difference from among the n power differences and the power difference of the further candidate frequency and determines the candidate frequency that corresponds to the closest power difference as the frequency of the local signal.

6. A method comprising:
    detecting a power difference between a power value of a first signal that is obtained by digitalizing a signal that has passed through an analog filter provided in the subsequent stage of a mixer and a power value of a second signal generated by the first signal passing through a digital filter; and
    reading a theoretical power difference, which is a power difference between the power value of the first signal and the power value of the second signal when there is no interfering wave; and
    determining a frequency of a local signal to be input to the mixer based on the power difference that has been detected and the theoretical power difference.

7. The method according to claim 6, comprising determining the frequency of the local signal from among n types of (n is a natural number) candidate frequencies based on the power difference and the theoretical power difference.

8. The method according to claim 7, comprising:
    sequentially inputting local signals of the n types of candidate frequencies to the mixer;
    detecting, for each of the n types of candidate frequencies, n power differences by detecting the power difference between the power value of the first signal and the power value of the second signal;
    selecting the power difference that is the closest to the theoretical power difference from among the n power differences; and
    determining the candidate frequency that corresponds to the closest power difference to be the frequency of the local signal.

9. The method according to claim 6, comprising:
    sequentially inputting local signals of n types of (n is a natural number) candidate frequencies to the mixer;
    detecting, for each of the n types of candidate frequencies, n power differences by detecting the power difference between the power value of the first signal and the power value of the second signal;
    obtaining the order of the n power differences closer to the theoretical power difference; and
    determining a further candidate frequency of the local signal based on the order of the closeness.

10. The method according to claim 9, comprising:
    further detecting, for the further candidate frequency, the power difference between the power value of the first signal and the power value of the second signal;
    selecting the power difference that is the closest to the theoretical power difference from among the n power differences and the power difference of the further candidate frequency; and determining the candidate frequency that corresponds to the closest power difference to be the frequency of the local signal.

* * * * *